United States Patent
Chang et al.

(10) Patent No.: US 7,334,113 B2
(45) Date of Patent: Feb. 19, 2008

(54) METHOD AND SYSTEM FOR PROCESSING AN INSTRUCTION SET

(75) Inventors: Rong-Guey Chang, Min-Hsiung Chia-Yi (TW); Shao-Yang Wang, Min-Hsiung Chia-Yi (TW)

(73) Assignee: National Chung Cheng University (TW)

( * ) Notice: Subject to any disclaimer, the term of this patent is extended or adjusted under 35 U.S.C. 154(b) by 144 days.

(21) Appl. No.: 11/220,497

(22) Filed: Sep. 7, 2005

(65) Prior Publication Data

US 2007/0055849 A1 Mar. 8, 2007

(51) Int. Cl.
*G06F 15/00* (2006.01)

(52) U.S. Cl. .................. 712/226; 712/220

(58) Field of Classification Search .......... 712/220, 712/226

See application file for complete search history.

(56) References Cited

U.S. PATENT DOCUMENTS 6,044,450 A * 3/2000 Tsushima et al. ......... 712/24

* cited by examiner

Primary Examiner—Eddie Chan
Assistant Examiner—John Lindlof
(74) Attorney, Agent, or Firm—Schmeiser, Olsen & Watts

(57) ABSTRACT

The present invention provides a method and system for processing an instruction set, which can be applied to compress the operation part of a sequence of instructions in the instruction set and to perform the corresponding decompression. Upon the compression, the sequence of instructions is divided into a operation part and a register part, then recursively compress consecutive instructions with two operation codes that emerge repeatedly in the sequence of instructions until no further compression can be performed. The compression leads to form a binary tree which constitutes of nodes corresponding to the original operation codes or the ones derived from them in the recursive compression process. Furthermore, a pre-fetch mechanism is used in the present invention to promote the performance upon decompression. According to standard tests performed with SPEC 2000, DSPstone, Mediabench, and MPEG4 benchmarks on the basis of the ARM instruction set, a code size reduction of 33% on average with a decompression overhead of only 3% can be reached.

7 Claims, 6 Drawing Sheets

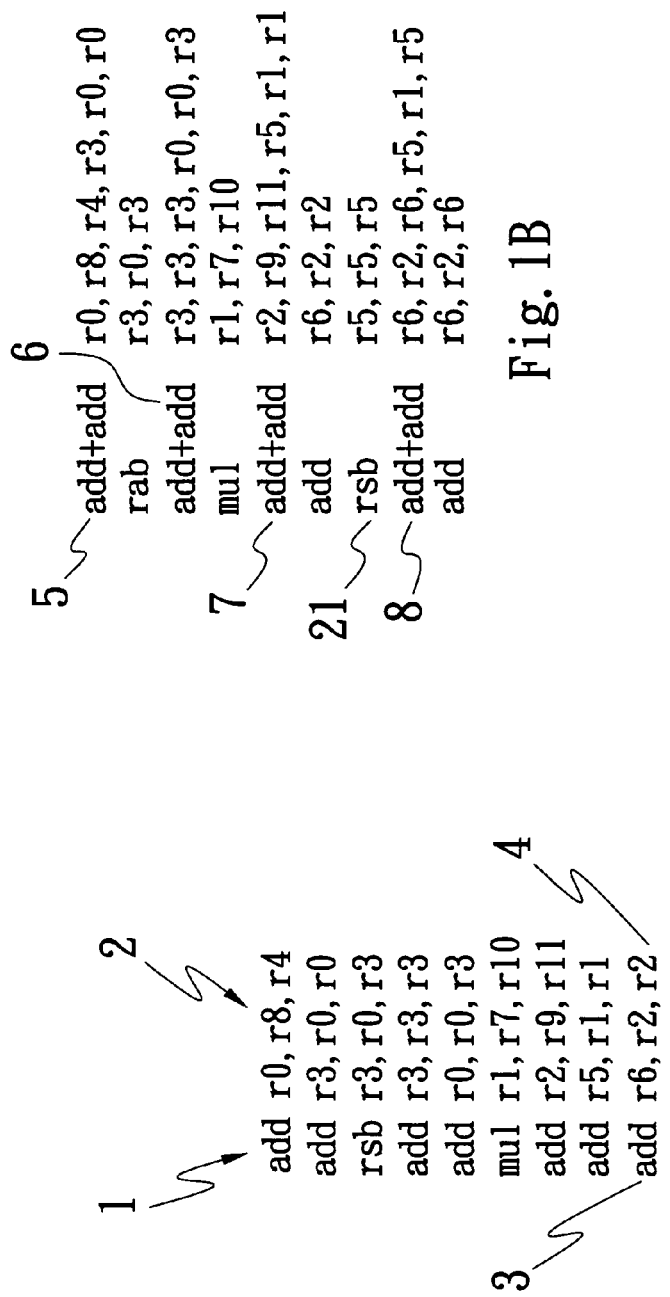
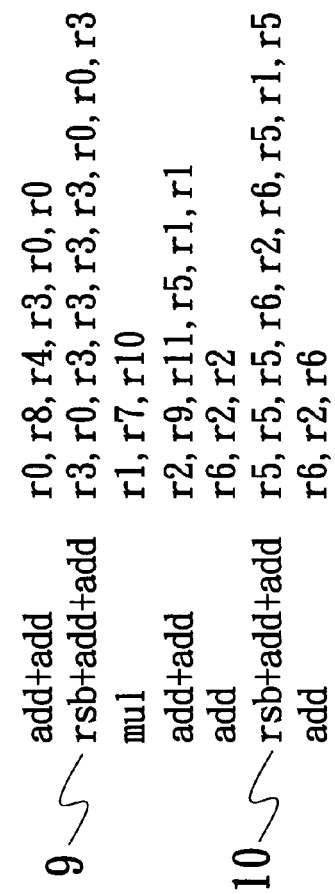
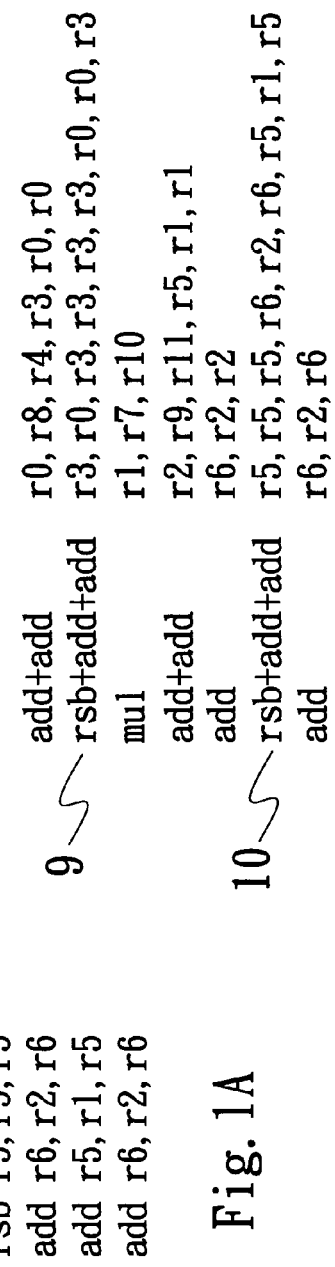

METHOD AND SYSTEM FOR PROCESSING AN INSTRUCTION SET

BACKGROUND OF THE INVENTION

1. Field of the Invention

The present invention relates to a method and system for processing an instruction set, specifically a method and system which is configured to compress the operation part in an instruction set, and to perform the corresponding decompression, wherein upon the compression an instruction sequence in the instruction set is divided into a operation part and a register part, and the operation codes most repeatedly emerging in two successive instructions are compressed, and furthermore, a pre-fetch mechanism can be used to promote the performance upon the decompression.

2. Description of the Prior Art

Due to limited memory in an embedded system the size of an application program code has to be reduced as far as possible. Especially for portable products, the reduction of the memory size leads to the reduction of cost, power consumption, volume and weight. The necessary memory size usually depends on the code size and the data size. It has become very important, therefore, to find a way for reducing the code size to lower the demand on the memory size.

In order to reduce the code size, new hardware frames have been proposed in several familiar techniques. ARM Technologies Inc. and MIPS Technologies Inc. have proposed ARM Thumb instruction set and MIPS16 respectively as a shorter instruction set for reducing the code size. However, because an original long instruction could have to be represented with many shorter instructions, the performance during the code execution is significantly reduced. On the other hand, International Business Machines (IBM) Corps. has taken Huffman encoding for their compression, partitioning a code word into two parts and applying Huffman encoding to these two parts separately. Its drawback is that Huffman encoding results in variable lengths of the code word so that this method pays a lot of penalty in decompression and performance.

In other techniques, code compression has been achieved in terms of software. Based on an 80-20 rule taken in a profile-guided code compression, a substantial performance loss can be avoided by compressing the instructions that are executed infrequently. But the compression ratio is reduced as compared with the hardware techniques as described above. Furthermore, in some further techniques this issue has been addressed by using a dictionary table, assigning each of the frequently occurring instructions to an index in the dictionary table. Then the index can be used to look up the dictionary table to fetch the correct instruction. The benefit of the techniques based on a dictionary is ease in decompression, but the corresponding compression ratio is only from 13% to 18%. This issue has been addressed by applying a hybrid technique, compressing a code according to different program characteristics to achieve a very high compression ratio. But the shortcoming of the hybrid technique is that the decompression and the execution can not be carried out at the same time, having to complete the compression before starting the execution.

Drawbacks of the known compression techniques described above are summarized as fallows:

1. The compression ratio and the performance can not be given consideration at the same time. A high compression ratio is accompanied by a loss in the performance, and the achievement of a high performance results at the same time in a low compression ratio.

2. Some techniques can only be applied to specific platforms, which limits their applicability.

3. In the techniques of high compression ratio the decompression and execution can not be carried out simultaneously, resulting in substantial performance loss.

SUMMARY OF THE INVENTION

The present invention is devoted to overcoming the drawbacks of the prior art techniques described above, providing a new technique for raising the compression ratio without a substantial loss in the performance, which facilitates carrying out the decompression and the program execution simultaneously and can be generally applied to different platforms.

For the purpose mentioned above the present invention provides a method and system for processing an instruction set, wherein, upon the compression, the sequence of instructions is divided into a operation part and a register part, then recursively compress consecutive instructions with two operation codes that emerge repeatedly in the sequence of instructions until no further compression can be performed. The compression leads to form a binary tree which constitutes of nodes corresponding to the original operation codes or the ones derived from them in the recursive compression process. Furthermore, a pre-fetch mechanism is used in the present invention to promote the performance upon decompression.

A method for processing an instruction set according to the present invention comprises steps of: (1) identifying all different multiple original operation codes in an instruction sequence of said instruction set, storing said multiple original operation codes into an instruction table consisting of multiple instruction items, and generating a register table for storing a register part of the instruction sequence; (2) generating a pointer sequence consisting of multiple pointers in proper order according to the instruction sequence, wherein each of said pointers indicates, as specified by its content value, one of said multiple instruction items of said instruction table, and the content values of said pointer sequence are stored in proper order into an index table; (3) recursively carrying out a deriving step to exhaust successive instructions with two operation codes that repeatedly emerge, so as to generate a compressed instruction set comprising said instruction table, said register table and said index table, and to generate correspondingly a binary tree, wherein in said deriving step multiple new pointers are generated correspondingly as new multiple nodes of said binary tree, and in said pointer sequence all two successive pointers consisting of a left pointer and a right pointer with the most frequently repeating content values are replaced with said multiple new pointers, and a new instruction item is generated in said instruction table to store a derived operation code comprising a left part and a right part, and all said multiple new pointers indicate said new instruction item in said instruction table, said left part and said right part being respectively for storing the content values of said left pointer and said right pointer; (4) carrying out a decompression step, wherein multiple executable instructions contained in the instruction sequence, which is addressed in said step (1), are generated in proper order according to said index table, said instruction table and said register table.

A system for processing an instruction set according to the present invention, being adapted to decompressing a compressed instruction set, said compressed instruction set comprises an index table, an instruction table, and a register table, and said system for processing an instruction set comprising a first decompression section, a second decompression section, and a buffer, wherein said first decompression section is configured to store the information of an operation code according to said index table and said instruction table into said buffer, and said second decompression section is configured to get the information of said operation code from said buffer and combine it with the information stored in said register table, so as to generate in proper order executable instructions.

The method and system for processing an instruction set of the present invention can further comprise a pre-fetch mechanism, generating upon the compression a prefetch information which is used upon the decompression to promote the performance.

To facilitate understanding the purpose of the present invention and its characteristics and effects, a specific embodiment of the present invention is described in detail as follows.

BRIEF DESCRIPTION OF THE DRAWINGS

FIG. 1A shows schematically an instruction sequence contained in a program code before the compression;

FIG. 1B shows schematically a compressed instruction sequence of the instruction sequence shown in FIG. 1A;

FIG. 1C shows schematically a further compressed instruction sequence of the compressed instruction sequence shown in FIG. 1C;

Figure 1D:
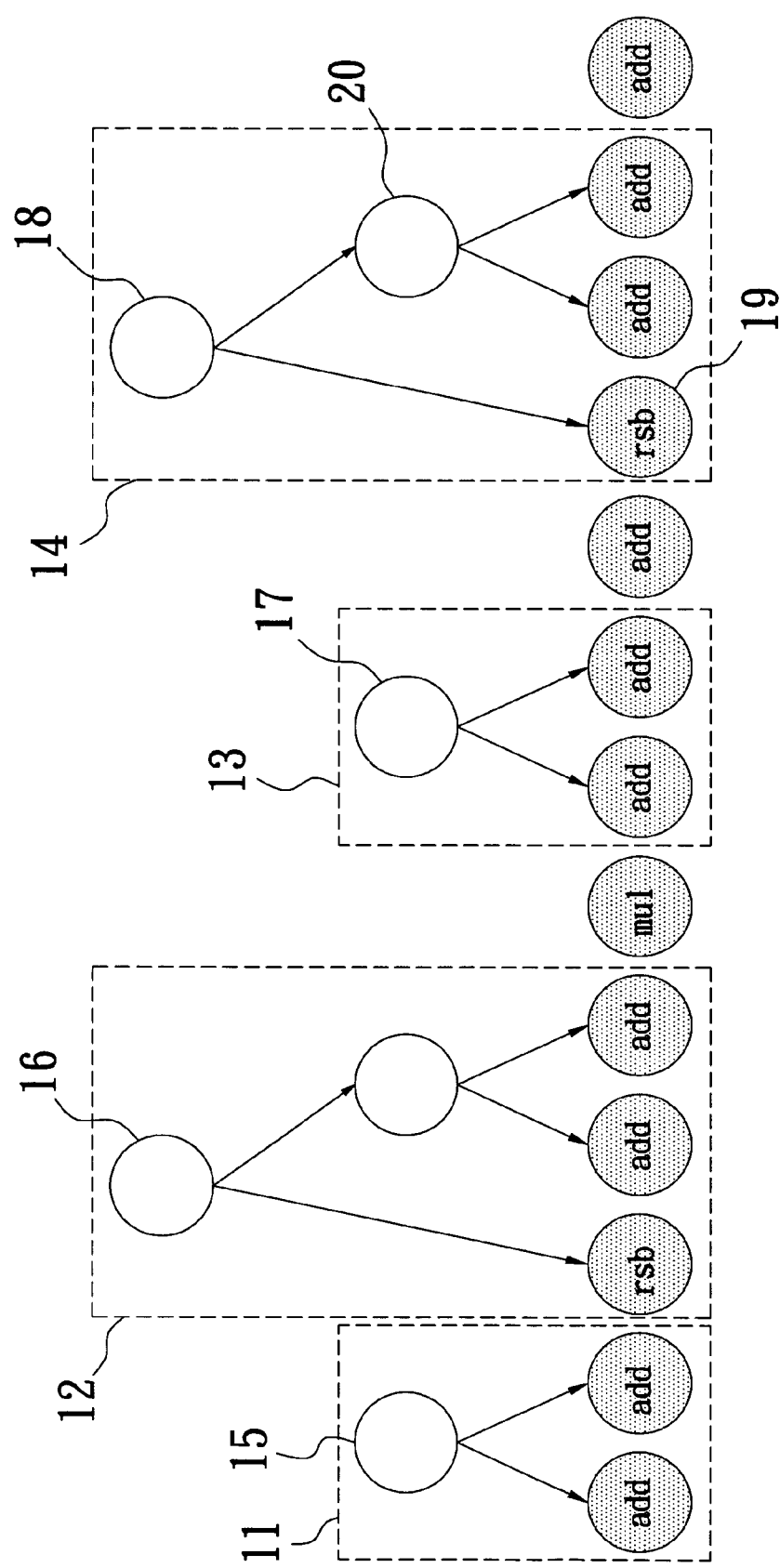
FIG. 1D shows a binary tree with four sub-trees resulting from the compression procedure described in FIG. 1A, FIG. 1B, and FIG. 1C.

DESCRIPTION OF MAIN COMPONENTS 1 section of operation code
2 register part
3 original operation code
4 register part
5 derived operation code
6 derived operation code
7 derived operation code
8 derived operation code
9 another derived operation code
10 another derived operation code
11 sub-tree
12 sub-tree
13 sub-tree
14 sub-tree
15 root
16 root
17 root
18 root
19 left node
20 right node
21 original operation code
22 instruction table
23 first bit
24 register table
25 index table
26 index table
27 instruction table
28 register table
29 first decompression section
30 second decompression section
31 buffer
32 central processing unit (CPU)
33 first decompressor
34 first stack
35 second decompressor
36 second stack

DETAILED DESCRIPTION OF THE INVENTION

FIG. 1A, FIG. 1B, FIG. 1C and FIG. 1D explain the principle of the code compression according to the present invention, showing schematically an instruction sequence contained in a program code before the compression, a compressed instruction sequence of this instruction sequence, its further compressed instruction sequence, and a resulting binary tree. The binary tree comprises four sub-trees and consists of nodes represented with circles, wherein, a solid circle corresponds to an original operation code of the instruction sequence before the compression, a hollow circle corresponds to a derived operation code generated by the recursive compression. At first, we ignore the register part and observe only the operation part. As shown in FIG. 1A, the original instruction sequence comprises thirteen instructions, each instruction comprising an operation part 1 and a register part 2. The operation code contained in the original instruction sequence is referred as an original operation code. Taking the ninth instruction for example, its (original) operation code 3 is a d d, and its register part 4 is r6, r2, r2. The original instruction sequence contains many successive instructions with two operation codes that repeatedly emerge. As shown in FIG. 1B, an compressed instruction sequence is generated by compressing the most frequently emerging successive two operation codes a d d/a d d, wherein, the operation codes a d d/a d d in FIG. 1A are replaced with a derived operation code 5, 6, 7, 8 represented with a d d+a d d. Then the most frequently emerging successive two operation code r s b/a d d+a d d in FIG. 1C is then compressed to another derived operation r s b+a d d+a d d 9, 10, which replaces the operation code r s b/a d d+a d d in FIG. 1B, generating the further compressed instruction sequence in FIG. 1C. It is noted that the further compressed instruction sequence no longer contains a successive instruction with repeatedly emerging operation codes. The compression according to the present invention proceeds recursively according to the principle described above until no further compression can be performed. Due to compressing two operation codes in each move, the result ca be represented with a binary tree. This binary tree may comprises multiple sub-trees, constituting of nodes that respectively correspond to an original operation code or a derived operation code. Each of the sub-trees has a root located on its top, and a node corresponding to a derived operation code has left node and a right node As shown in FIG. 1D, each of the four sub-trees 11 12, 13, 14 has on its top a root 15, 16, 17, 18. Taking the node 18 (also a root) for example, it is represented as a derived operation code 10 with r s b+a d d+a d d in FIG. 1C, and its left node 19 and right node 20 respectively correspond to an original operation code 21 of r s b and a derived operation code 8 of a d d+a d d in FIG. 1B.

The information needed for the decompression can be stored upon the compression into a memory or a Cache memory. However, the way for storing the information is not limited in the present invention. A method and system for processing an instruction set of the present invention is explained in detail with the following embodiment as an example, wherein the information needed for the decompression, the pre-fetch mechanism, and the system and method for the decompression are elucidated.

Figure 2:
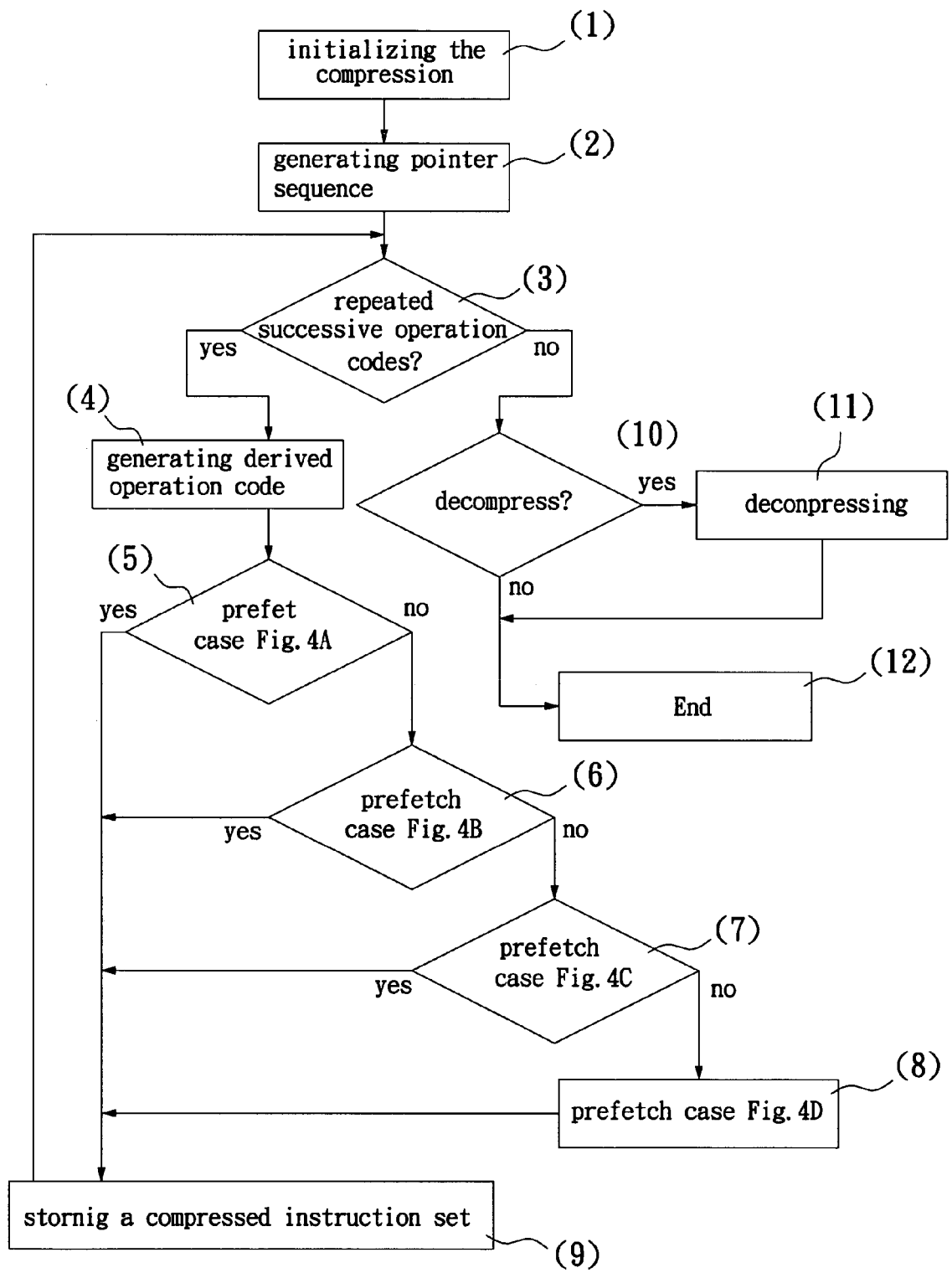
FIG. 2 shows a flow chart of the embodiment of a method for processing an instruction of the present invention.
Figure 3:
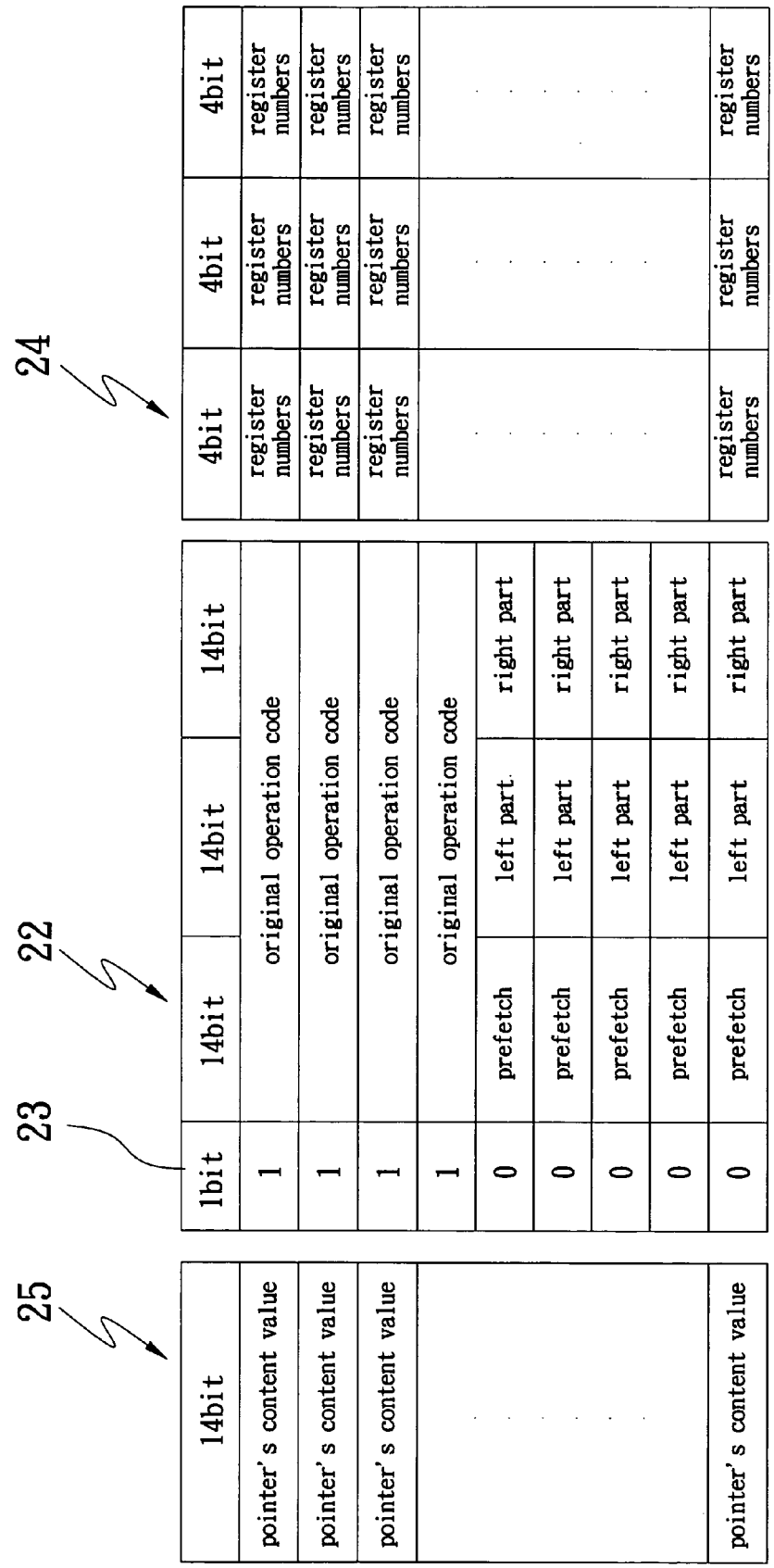
FIG. 3 shows schematically the structure of the data needed for the decompression, which is stored in a memory or a Cache memory.
Figure 4A:
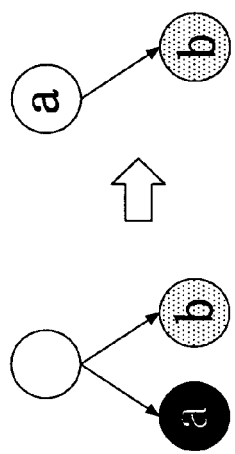
FIG. 4A, FIG. 4B, FIG. 4C, and FIG. 4D show different structures of the binary tree corresponding to all four cases for generating a prefetch information.
Figure 4B:
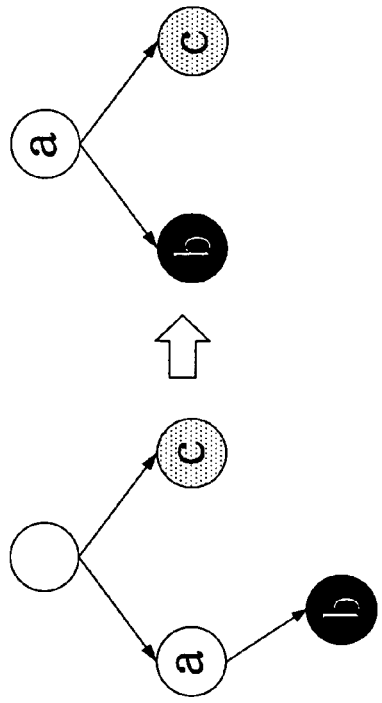
Figure 4C:
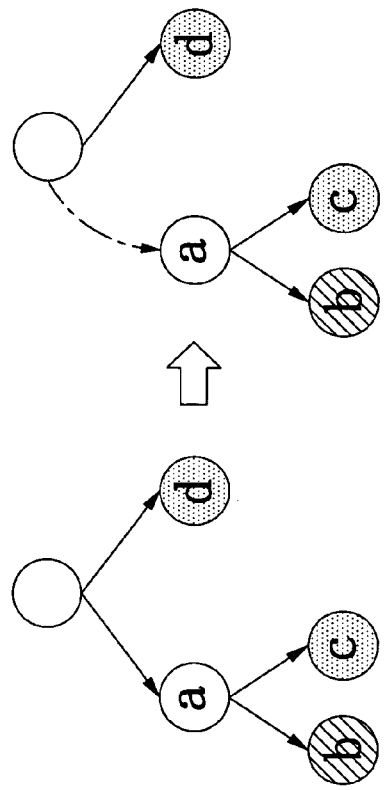
Figure 4D:
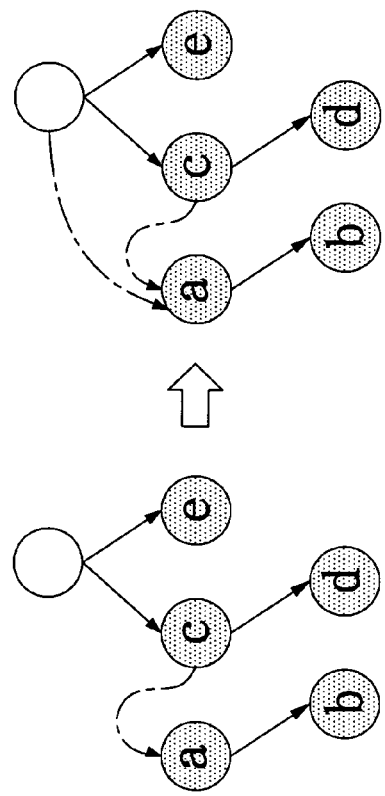

FIG. 2 shows a flow chart of the embodiment of a method for processing an instruction of the present invention. FIG. 3 shows schematically an example how the needed information can be stored in the memory or the Cache memory, which can be applied to the present invention. FIG. 4A, FIG. 4B, FIG. 4C and FIG. 4D show all four possibilities upon storing a prefetch information, wherein, each circle represents a node of the binary tree, corresponding to one of the pointers in the instruction sequence contained in the instruction set. The letter within solid circles represents an original operation code to which the node under observation indicates, whereas the other circles represent a derived operation code to which the observed node indicate and its left arrow and right arrow indicate to the nodes according to the content values of its left part and right part respectively. If a left arrow or a right arrow is not available, it means that the content value stored in the corresponding left part or right part is empty. A circle with a point lattice means a node which is to be ignored when a prefetch information is determined. A circle with slanted lines means a node which connects a sub-tree containing empty content values and is also to be ignored when a prefetch information is determined. Furthermore, a dotted line indicates to a node that corresponds to a derived operation code whose prefetch information determines the prefetch information of the node under observation. As shown in FIG. 2, FIG. 3, FIG. 4A, FIG. 4B, FIG. 4C, and FIG. 4D, a method for processing an instruction set according to the present invention comprises:

(1) identifying in an instruction sequence of the instruction set all different multiple original operation codes, storing said multiple original operation codes into an instruction table 22 with multiple instruction items, setting the content value of the first bit 23 of each said instruction item to be 1 which marks such instruction items as those storing and corresponding to an original operation code, further generating a register table 24 to store a register part of the instruction sequence, wherein the first column of said instruction table 22 and said register table 24 describes the information length for each row in unit of bit;

(2) generating a pointer sequence containing multiple pointers in proper order according to said instruction sequence, each of said multiple pointers indicating, according to its content value one of said multiple instruction items in said instruction table 22, the content values of said pointer sequence being stored in proper order in an index table 25, and the first row of said index table 25 describing the information length for each row in unit of bit;

(3) determining whether said pointer sequence contains two successive pointers with content values that emerge repeatedly, if so, proceeding to the next step, otherwise proceeding to step (10);

(4) carrying out a deriving step to evolve the binary tree, wherein, multiple new pointers, which correspond to additional new multiple nodes appended to the binary tree, are generated to replace all two successive pointers with a left pointer and a right pointer storing the most frequently repeated content values in said pointer sequence, and a new instruction item of said instruction table is generated to store a derived operation code consisting of a left part, a right part, and a prefetch information, and all said multiple new pointers indicate said new instruction item storing said derived operation code in said instruction table, and the content values of said left pointer and said right pointer are respectively stored into said left part and said right part, and furthermore, the first bit 23 of said new instruction item is set to 0 to mean that said new instruction item contains and corresponds to a derived operation code;

(5) determining whether the content value of said left pointer corresponds to one of said multiple original operation codes, if so (corresponding to the case shown in FIG. 4A), then storing the content value of said left pointer into said prefetch information, clearing the content value of said left part to be empty, and proceeding to step (3), otherwise proceeding to the next step;

(6) identifying a left-left part and a left-right part of an old derived operation code corresponding to the content value of said left pointer, determining whether the content value of said left-left part is empty and said left-right part indicates one of said multiple original operation codes, if so (corresponding to the case shown in FIG. 4B), then storing the content value of an old prefetch information of said old derived operation code into said prefetch information, storing the content value of said left-right part into said left part, and proceeding to step (3); otherwise proceeding to step;

(7) determining whether said old prefetch information indicates one of said multiple original operation codes, if so (corresponding to the case shown in FIG. 4C), then storing the content value of said left pointer into said prefetch information, clearing the content value of said left part to be empty, and proceeding to step (9);otherwise proceeding to the next step;

(8) storing the content value of said old prefetch information into said prefetch information, and storing the content value of said left pointer into said left part; the present step corresponds to FIG. 4D;

(9) storing a compressed instruction set, and proceeding to step (3), wherein, said compressed instruction set comprises said instruction table 22, said register table 24 and said index table 25 containing the content values of said pointer sequence;

(10) determining whether the decompression is to be carried out, if so, then proceeding to the next step, otherwise proceeding to step (12);

(11) carrying out a decompression step, wherein, multiple operation codes are determined according to said index table and said instruction table in proper order, and said multiple operation codes are combined with corresponding register part stored in said register table to generate in proper order multiple executable instructions of the original instruction sequence of step (1), and for any one of said multiple operation codes, which corresponds to a root or a right node of said binary tree, a prefetch information is processed with priority;

(12) End.

Figure 5:
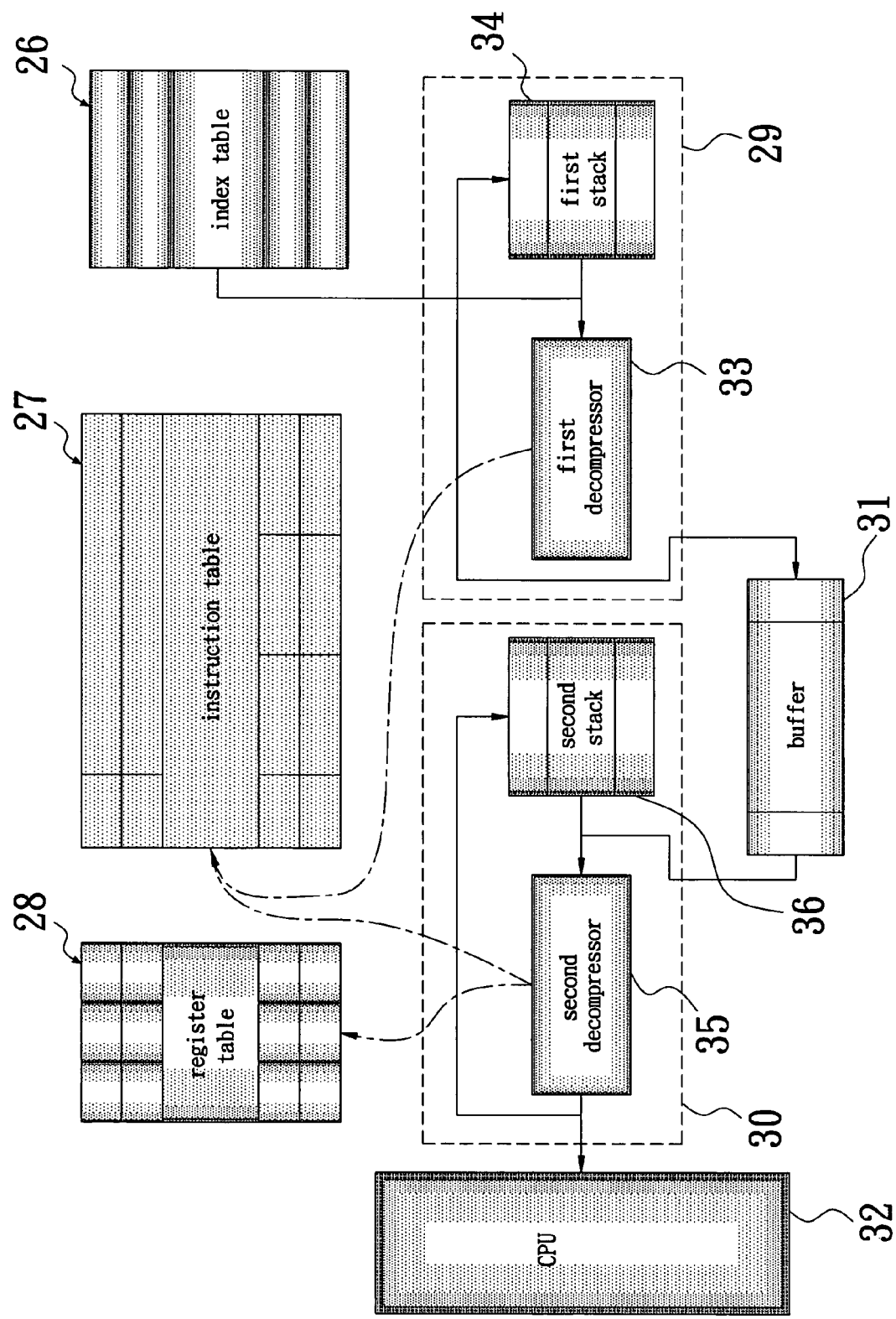
FIG. 5 explains schematically the present invention with an operation example.

The present invention further provides a system for processing an instruction set, which is adapted to decompressing a compressed instruction set, wherein said compressed instruction set comprises an index table 26, an instruction table 27, and a register table 28 with a data structure as shown the example in FIG. 3. FIG. 5 shows schematically an example of the operation of said system for processing an instruction set. As shown in FIG. 5, said system for processing an instruction set comprises a first decompression section 29, a second decompression section 30, and a buffer 31, wherein said first decompression section 29 is configured to store the information of an operation code according to said index table 26 and said instruction table 27 into said buffer 31, and said second decompression section 30 is configured to get the information of said operation code from said buffer 31 and combine it with the information stored in said register table 28, so as to generate in proper order executable instructions. The executable instructions can be passed to the central processing unit (CPU) 32 for execution. In the system for processing an instruction set, as shown in FIG. 5, said first decompression section 29 further comprises a first decompressor 33 and a first stack 34, and said second decompression section 30 further comprises a second decompressor 35 and a second stack 36.

The structure of the information needed for the decompression according to the present invention is shown with the example in FIG. 3. Said information needed for the decompression comprises an index table 25, an instruction table 22 and a register table 24.

As shown in FIG. 2, according to the present invention, a method for processing an instruction set may further comprise a decompression step containing a pre-fetch mechanism, wherein, the step (11) in FIG. 2 comprises a decompression step containing a pre-fetch mechanism. In the decompression step, a system for processing an instruction set as shown in FIG. 5, which comprises a first decompressor 33, a first stack 34, a second decompressor 35, a second stack 36 and a buffer 31, wherein said first stack 34 and said second stack 36 operate according to the usual first-in-last-out rule. In the decompression step said first decompressor 33 is used to recursively carry out the steps of:

(111) determining whether said first stack 34 is empty, if so, then taking a first pointer from said index table 26, otherwise taking said first pointer value from said first stack 34;

(112) determining whether said first pointer indicates one of said multiple original operation codes in said instruction table 27, if so, then storing the original operation code indicated by said first pointer into said buffer 31, otherwise proceeding to the next step;

(113) storing in proper order the content values of the right part and left part of the derived operation code indicated by said first pointer into said first stack 34, and if first pointer indicates a root or a right node of said binary tree, then storing the content value of a prefetch information of the derived operation code indicated by said first pointer into said buffer 31; according the pre-fetch mechanism contained in the present step the prefetch information stored in said instruction table 27 is used to promote the execution performance upon the decompression. Furthermore, in the decompression step mentioned above, said second decompressor 35 is used to recursively carry out steps of:

(114) determining whether said second stack 36 is empty, if so, then taking a second pointer from said index table 26, otherwise taking said second pointer from said second stack 36;

(115) determining whether said second pointer indicates one of said multiple original operation codes in said instruction table, if so, then combining the original operation code indicated by said second pointer with the register part taken from said register table 28 according to the program counter, so as to generate an executable instruction and pass said executable instruction to the central processing unit 32 for execution, otherwise proceeding to the next step;

(116) storing in proper order the content values of the right part and the left part of the derived operation code indicated by said second pointer into said second stack 36.

According to the method and system of the present invention described above, an instruction set of a program can be compressed effectively and executed simultaneously upon the decompression without a substantial loss of performance. In fact, according to standard tests of the method and system for processing an instruction set of the present invention, being performed with SPEC 2000, DSPstone, Mediabench, and MPEG4 benchmarks on the basis of the ARM instruction set, a code size reduction of 33% on average with a decompression overhead of only 3% can be reached. It is to be noted that the method and system for processing an instruction set of the present invention can be applied to different platforms, which solves the problem of limited application of the prior art described above.

While the present invention has been illustrated with the preferred embodiment, it will be understood by those skilled in the art that the foregoing and other changes in form and details may be made therein without departing from the spirit and scope of the present invention which should be limited only by the scope of the appended claims.

The present invention has been described with a preferred embodiment thereof and it is understood that many changes and modifications in the described embodiment can be carried out without departing from the scope and the spirit of the invention as defined by the appended claims.

What is claimed is:

1. A method for processing an instruction set, comprising steps of:

(1) identifying all different multiple original operation codes in an instruction sequence of said instruction set, storing said multiple original operation codes into an instruction table consisting of multiple instruction items, and generating a register table for storing a register part of the instruction sequence;

(2) generating a pointer sequence consisting of multiple pointers in a first order wherein said first order is according to the multiple original operation codes of the instruction sequence, wherein each of said pointers points to, as specified by its content value, one of said multiple instruction items of said instruction table, and the content values of said pointer sequence are stored in said first order into an index table;

(3) recursively carrying out a deriving step to generate a compressed instruction set comprising said instruction table, said register table and said index table, wherein the compressed instruction set is generated by compressing the most frequently emerging successive two operation codes that repeatedly emerge in the instruction sequence, until the compressed instruction sequence no longer contains any repeatedly emerging successive two operation codes, and to generate correspondingly a binary tree having roots, left nodes and right nodes, wherein in said deriving step multiple new pointers are generated correspondingly as new multiple nodes of said binary tree, and in said pointer sequence all two successive pointers consisting of a left pointer and a right pointer with the most frequently repeating content values are replaced with said multiple new pointers, and a new instruction item is generated in said instruction table to store a derived operation code comprising a left part and a right part, and all said multiple new pointers point to said new instruction item in said instruction table, said left part and said right part being respectively for storing the content values of said left pointer and said right pointer, wherein said derived operation code further comprises a prefetch information, wherein said deriving step further comprises:

determining whether the content value of said left pointer corresponds to one of said multiple original operation codes, and if so, storing the content value of said left pointer into said prefetch information and clearing the content value of said left part, otherwise proceeding to the next step;

identifying a left-left part and a left-right part of an old derived operation code corresponding to the content value of said left pointer, determining whether the content value of said left-left part has been cleared and said left-right part points to one of said multiple original operation codes, and if so, storing the content value of an old prefetch information contained in said old derived operation code into said prefetch information and storing the content value of said left-right part into said left part, otherwise proceeding to the next step;

determining whether said old prefetch information points to one of said multiple original operation codes, and if so, storing the content value of said left pointer into said prefetch information and clearing the content value of said left part, otherwise proceeding to the next step; and storing the content value of said old prefetch information into said prefetch information, and storing the content value of said left pointer into said left part; and (4) carrying out a decompression step, wherein multiple executable instructions contained in the instruction sequence, which is addressed in said step (1), are generated in a second order wherein said second order is according to said index table, said instruction table and said register table.

2. The method for processing an instruction set of claim 1, wherein, said decompression step further comprises:

determining multiple operation codes in proper order according to said index table and said instruction table and combining each of said multiple operation codes with corresponding said register part stored in said register table, so as to generate multiple executable instructions in proper order, and wherein, if the operation code corresponds to any of the roots or the right nodes contained in said binary tree, then its prefetch information is processed.

3. The method for processing an instruction set of claim 2, wherein, in said decompression step, a first decompressor is used to recursively perform the steps of:

(1) determining whether a first stack is empty, and if so, taking out a first pointer value from said index table, otherwise taking out said first pointer value from said first stack;

(2) determining whether said first pointer value corresponds to one of said multiple original operation codes in said instruction table, and if so, storing that original operation code into a buffer, otherwise proceeding to the next step;

(3) storing in proper order the content values of the right part and left part contained in the derived operation code, to which said first pointer value corresponds, into said first stack, and if said first pointer value corresponds to any of the roots or the right nodes contained in said binary tree, storing the content value of the prefetch information contained in the derived operation code, which corresponds to said first pointer value, into said buffer;

and in said decompression step a second decompressor is used to recursively perform steps of:

(4) determining whether a second stack is empty, if so, taking out a second pointer value from said index table, otherwise taking out said second pointer value from said second stack;

(5) determining whether said second pointer value corresponds to one of said multiple original operation codes in said instruction table, and if so, combining that original operation code with the corresponding said register part taken from said register table, so as to generate an executable instruction which is then passed to a central processing unit, otherwise proceeding to the next step;

(6) storing in proper order the content values of the right part and left part contained in the derived operation code, to which said second pointer value corresponds, into said second stack.

4. A system for processing an instruction set, being adapted to generating a compressed instruction set from an original instruction sequence, generating correspondingly a binary tree having roots, left nodes and right nodes, decompressing a compressed instruction set, said compressed instruction set comprising an index table, an instruction table, and a register table, and said system for processing an instruction set comprising a first decompression section, a second decompression section, and a buffer, wherein said first decompression section is configured to store the information of an operation code according to said index table and said instruction table into said buffer, wherein said operation code further comprises a prefetch information, and said second decompression section is configured to get the information of said operation code from said buffer and combine it with the information stored in said register table, so as to generate in a first order executable instructions, wherein said first order is according to said original instruction sequence, wherein said system for processing an instruction set is further adapted to:

determining multiple operation codes in a second order according to said index table and said instruction table and combining each of said multiple operation codes with a corresponding register part stored in said register table, so as to generate multiple executable instructions in said first order, and wherein if the operation code corresponds to any root of said roots or right node of said right nodes contained in said binary tree, then said prefetch information is processed.

5. The system for processing an instruction set of claim 4, wherein, said first decompression section further comprises a first decompressor and a first stack, and said second decompression section further comprises a second decompressor and a second stack.

6. The system for processing an instruction set of claim 5, wherein the first decompressor is adapted to recursively perform the steps of:

(1) determining whether the first stack is empty, and if so, taking out a first pointer value from said index table, otherwise taking out said first pointer value from said first stack;

(2) determining whether said first pointer value corresponds to one of said multiple original operation codes in said instruction table, and if so, storing that original operation code into a buffer, otherwise proceeding to the next step;

(3) storing in proper order the content values of the right part and left part contained in the derived operation code, to which said first pointer value corresponds, into said first stack, and if said first pointer value corresponds to any of the roots or the right nodes contained in said binary tree, storing the content value of the prefetch information contained in the derived operation code, which corresponds to said first pointer value, into said buffer; and wherein the second decompressor is adapted to recursively perform steps of:

(4) determining whether the second stack is empty, if so, taking out a second pointer value from said index table, otherwise taking out said second pointer value from said second stack;

(5) determining whether said second pointer value corresponds to one of said multiple original operation codes in said instruction table, and if so, combining that original operation code with the corresponding said register part taken from said register table, so as to generate an executable instruction which is then passed to a central processing unit, otherwise proceeding to the next step;

(6) storing in proper order the content values of the right part and left part contained in the derived operation code, to which said second pointer value corresponds, into said second stack.

7. A method for processing an instruction set, comprising steps of:

(1) identifying all different multiple original operation codes in an instruction sequence of said instruction set, storing said multiple original operation codes into an instruction table consisting of multiple instruction items, and generating a register table for storing a register part of the instruction sequence;

(2) generating a pointer sequence consisting of multiple pointers in a first order wherein said first order is according to the multiple original operation codes of the instruction sequence, wherein each of said pointers indicates, according to its content value, one of said multiple instruction items of said instruction table, and the content values of said pointer sequence are stored in said first order into an index table;

(3) recursively carrying out, until there are no longer any repeated content values of two successive pointers in a said pointer sequence, a deriving step to evolve a binary tree, wherein multiple new pointers, which correspond to additional new multiple nodes appended to the binary tree, are generated to replace all two successive pointers with a left pointer and a right pointer storing the most frequently repeated content values of two successive pointers in said pointer sequence, and a new instruction item of said instruction table is generated to store a derived operation code consisting of a left part, a right part, and a prefetch information, and all said multiple new pointers indicate said new instruction item storing said derived operation code in said instruction table, and the content values of said left pointer and said right pointer are respectively stored into said left part and said right part; and (4) carrying out a decompression step, wherein multiple executable instructions contained in the instruction sequence, which is addressed in said step (1), are generated in a second order wherein said second order is according to said index table, said instruction table and said register table.

* * * * *